United States Patent
Kawamoto et al.

(10) Patent No.: US 11,894,211 B2
(45) Date of Patent: Feb. 6, 2024

(54) ELECTRON BEAM APPARATUS AND METHOD FOR CONTROLLING ELECTRON BEAM APPARATUS

(71) Applicant: Hitachi High-Tech Corporation, Tokyo (JP)

(72) Inventors: Erina Kawamoto, Tokyo (JP); Soichiro Matsunaga, Tokyo (JP); Souichi Katagiri, Tokyo (JP); Keigo Kasuya, Tokyo (JP); Takashi Doi, Tokyo (JP); Tetsuya Sawahata, Tokyo (JP); Minoru Yamazaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 180 days.

(21) Appl. No.: 17/621,503

(22) PCT Filed: Jul. 2, 2019

(86) PCT No.: PCT/JP2019/026322
§ 371 (c)(1),
(2) Date: Dec. 21, 2021

(87) PCT Pub. No.: WO2021/001932
PCT Pub. Date: Jan. 7, 2021

(65) Prior Publication Data
US 2022/0351934 A1    Nov. 3, 2022

(51) Int. Cl.
*H01J 37/077* (2006.01)
*H01J 37/075* (2006.01)
*H01J 37/18* (2006.01)

(52) U.S. Cl.
CPC .......... *H01J 37/077* (2013.01); *H01J 37/075* (2013.01); *H01J 37/18* (2013.01); *H01J 2237/006* (2013.01)

(58) Field of Classification Search
CPC ........ H01J 37/077; H01J 37/075; H01J 37/18; H01J 2237/006; H01J 2237/1825; H01J 37/06; H01J 37/065
See application file for complete search history.

(56) References Cited

U.S. PATENT DOCUMENTS

2011/0089336 A1    4/2011    Kasuya et al.

FOREIGN PATENT DOCUMENTS

JP    3926206 B2    3/2007
WO    2009/153939 A1    12/2009

OTHER PUBLICATIONS

International Search Report, PCT/JP2019/026322, dated Aug. 20, 2019, 1 pg.
Taiwan Office Action, Taiwanese Application No. 109117428, dated Mar. 17, 2021, 5 pgs.

*Primary Examiner* — Michael J Logie
*Assistant Examiner* — Christopher J Gassen
(74) *Attorney, Agent, or Firm* — Volpe Koenig

(57) ABSTRACT

The invention provides an electron beam apparatus that reduces a time required for an electron gun chamber to which a sputter ion pump and a non-evaporable getter pump are connected to reach an extreme high vacuum state. The electron beam apparatus includes an electron gun configured to emit an electron beam and the electron gun chamber to which the sputter ion pump and the non-evaporable getter pump are connected. The electron beam apparatus further includes a gas supply unit configured to supply at least one of hydrogen, oxygen, carbon monoxide, and carbon dioxide to the electron gun chamber.

12 Claims, 10 Drawing Sheets

[FIG. 1]
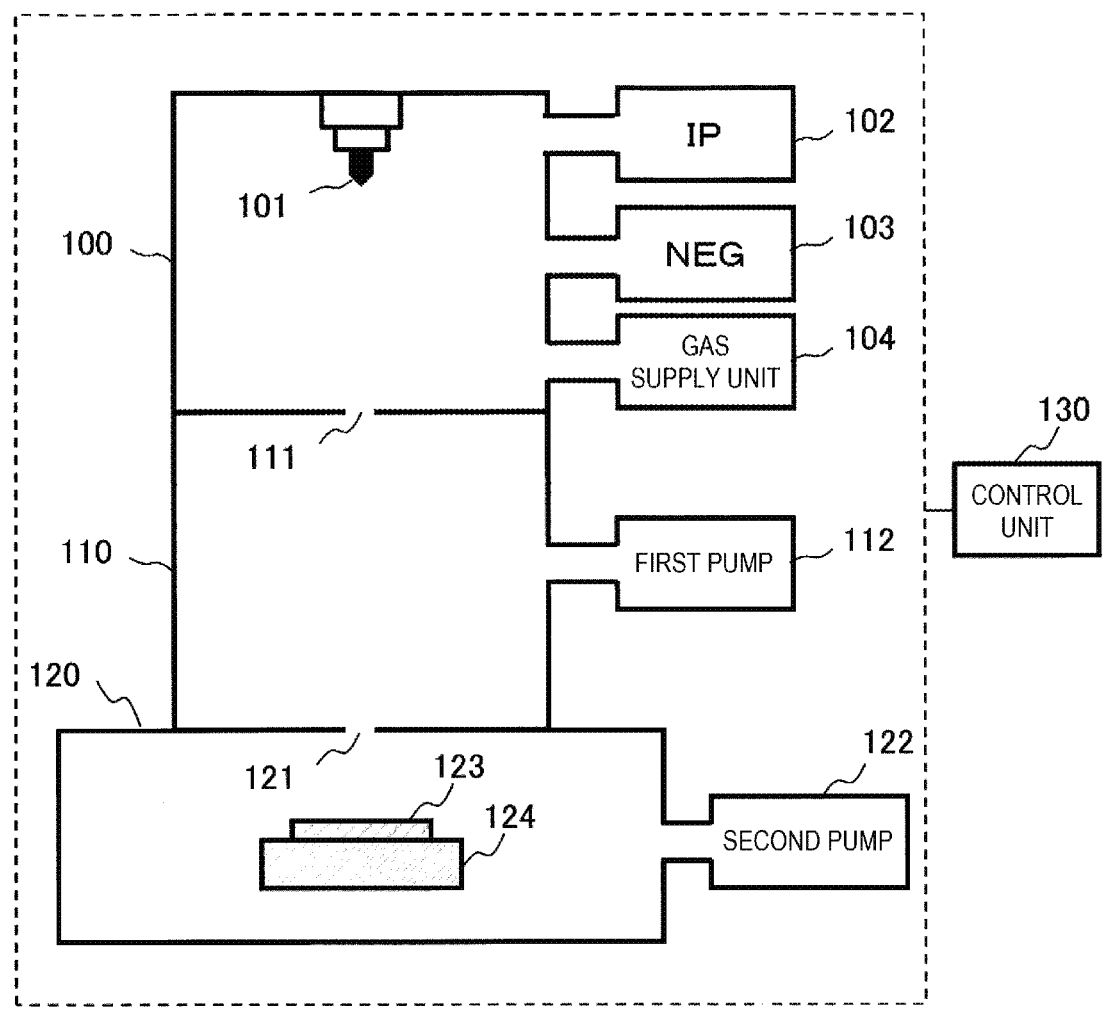

[FIG. 2]
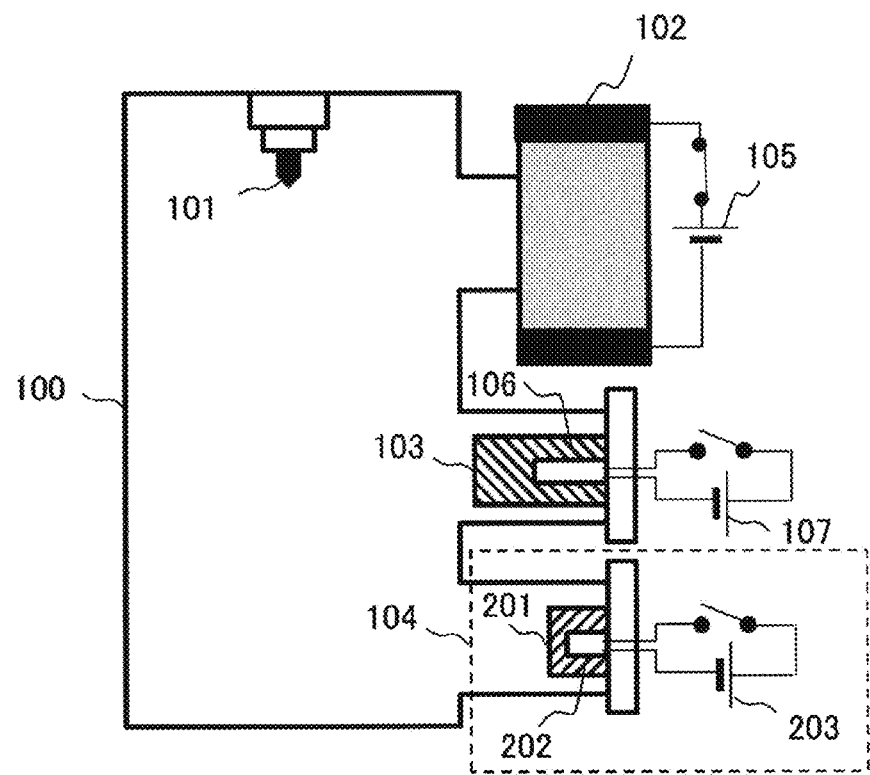

[FIG. 3]
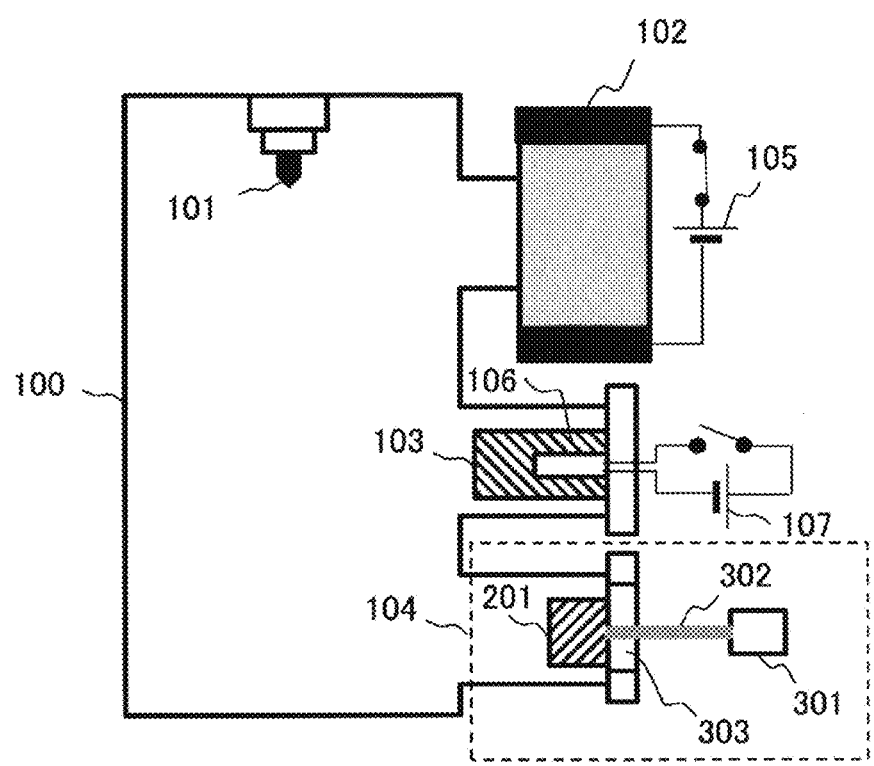

[FIG. 4]
| MATERIAL | LIGHT | PRINCIPLE | REACTION FORMULA |
|---|---|---|---|
| CALCIUM CARBONATE | INFRARED RAY | HEAT | $CaCO_3 \rightarrow CaO + CO_2$ |
| CARBOXYLIC ACID | INFRARED RAY | HEAT | |
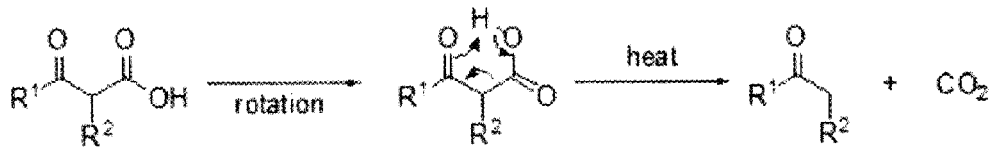

[FIG. 5]
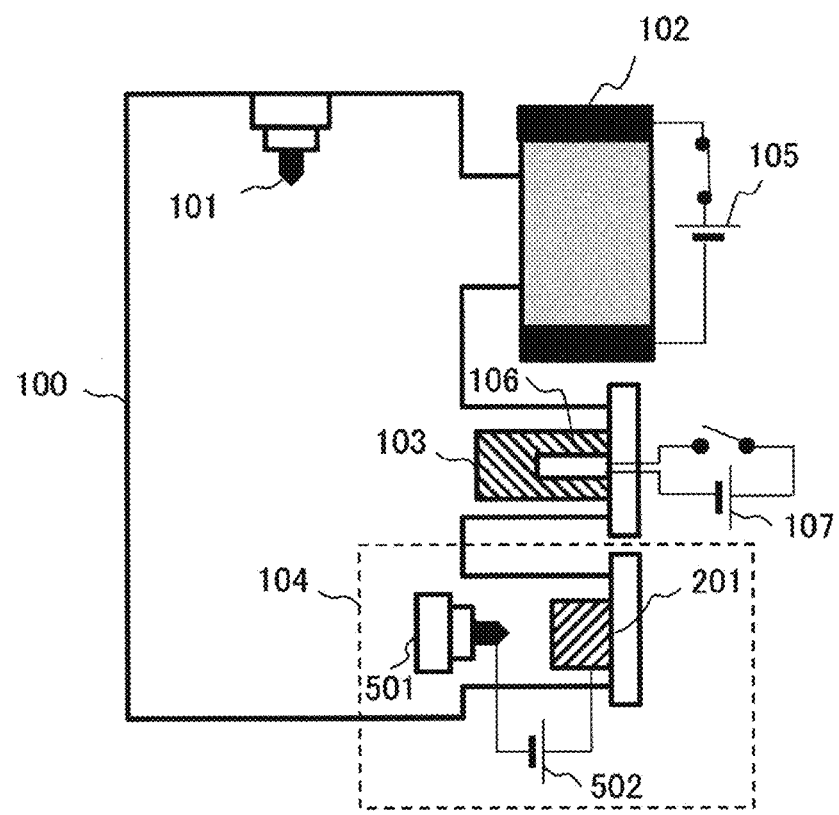

[FIG. 6]
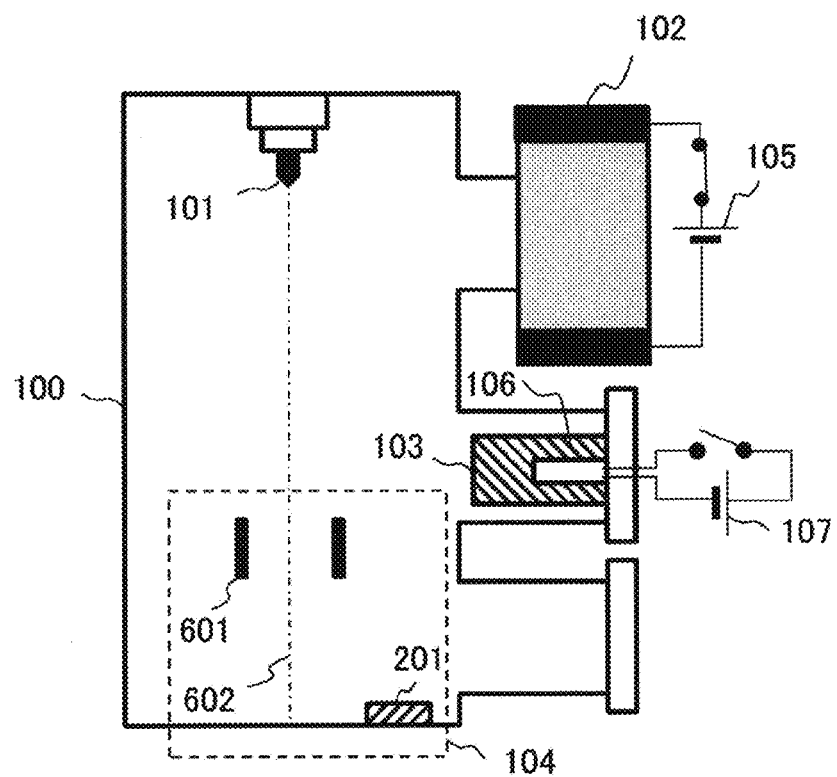

[FIG. 7]
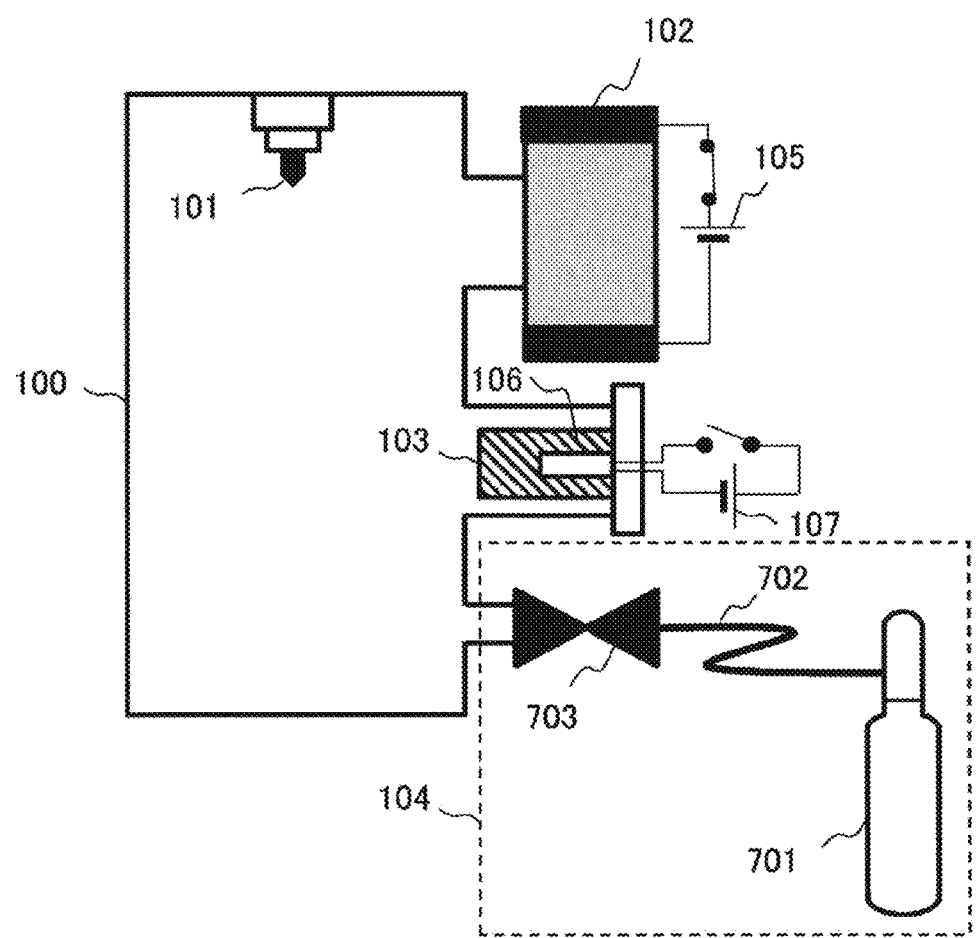

[FIG. 8]
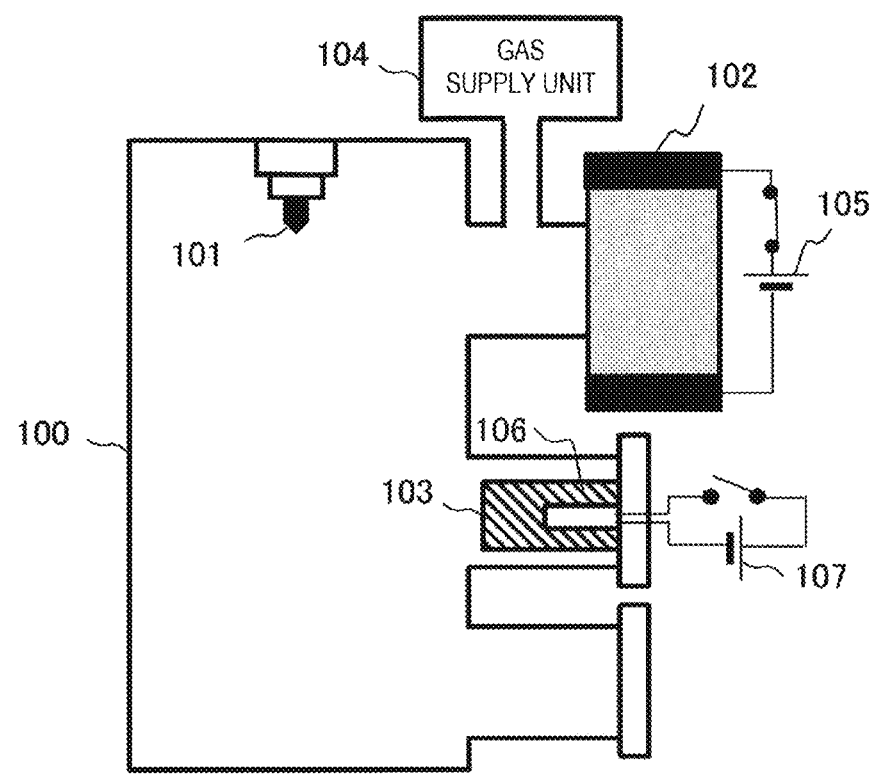

[FIG. 9]
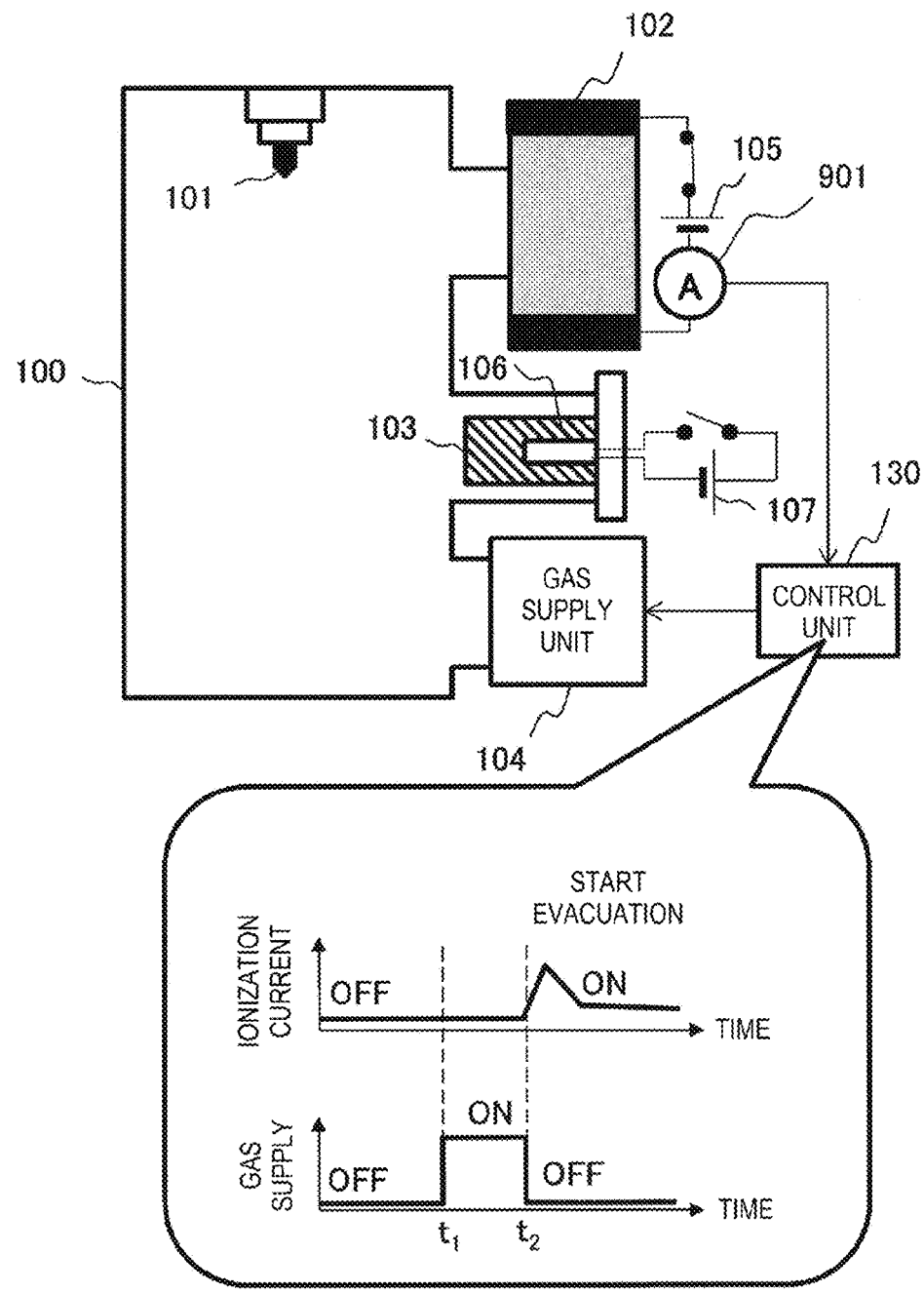

[FIG. 10]
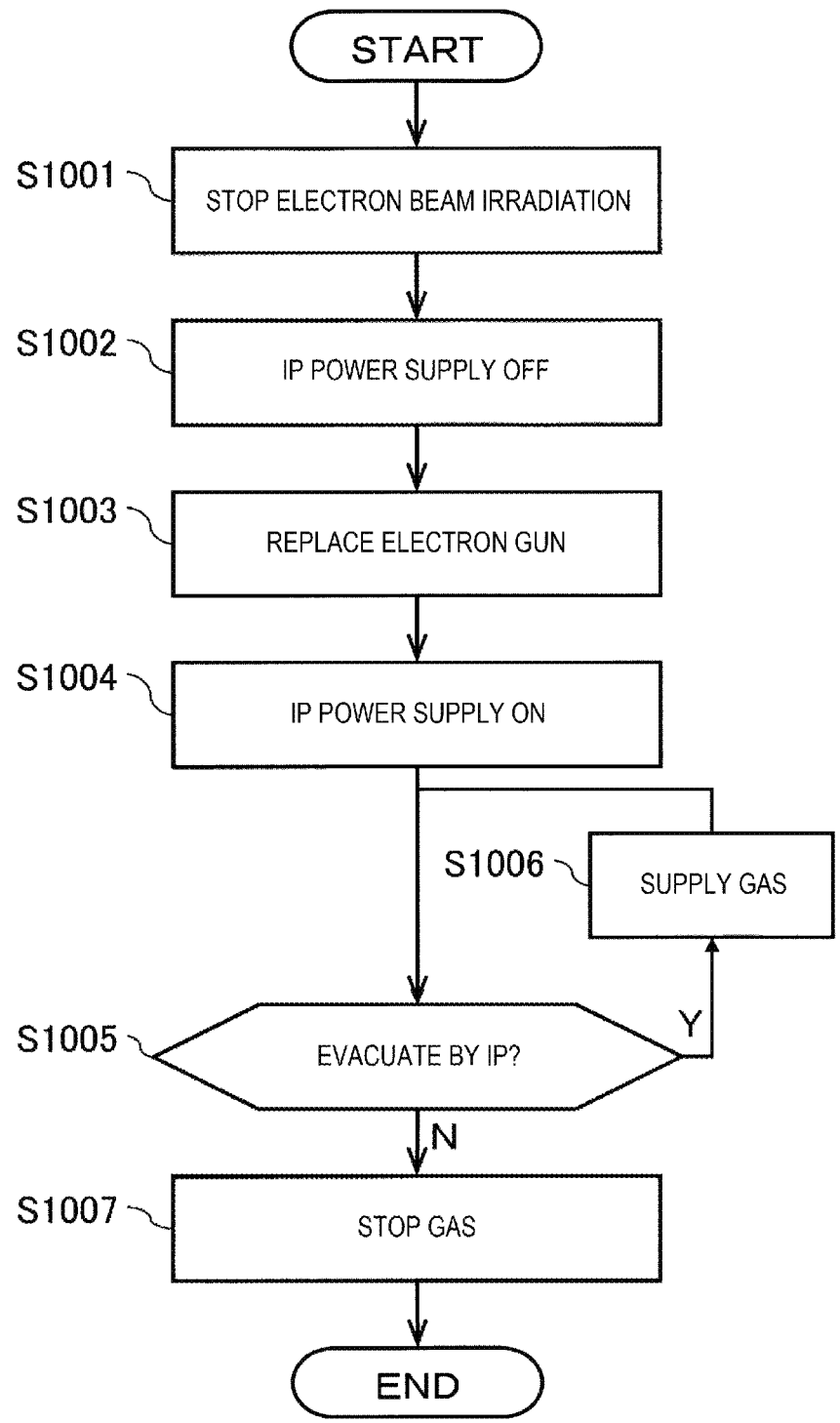

ELECTRON BEAM APPARATUS AND METHOD FOR CONTROLLING ELECTRON BEAM APPARATUS

TECHNICAL FIELD

The present invention relates to an electron beam apparatus represented by an electron microscope, and in particular, a technique for evacuating an electron gun chamber in which an electron gun is provided to an extreme high vacuum having a vacuum degree higher than that of an ultrahigh vacuum of $10^{-6}$ Pa to $10^{-8}$ Pa.

BACKGROUND ART

An electron microscope, which is an example of an electron beam apparatus, is used for observing various samples having a fine structure, and in particular, is used for dimensional measurement and defect inspection of a pattern formed on a semiconductor wafer in a manufacturing process of a semiconductor device. In the electron beam apparatus, in order to stabilize the amount of electrons of an electron beam emitted from an electron gun, it is required to improve a vacuum degree in an electron gun chamber in which the electron gun is provided.

PTL 1 discloses an extreme high vacuum evacuation device including a sputter ion pump (IP) and a non-evaporable getter (NEG) pump, in which an evacuation inducer that induces an evacuation of gas by the IP is supplied. In particular, PTL 1 discloses that, in an extreme high vacuum state, when the IP is temporarily stopped and then restarted, a vacuum vessel or the like is vibrated by an ultrasonic vibrator to release the gas adsorbed on a surface of a member and the gas is supplied as the evacuation inducer.

CITATION LIST

Patent Literature

PTL 1: Japanese Patent No. 3926206

SUMMARY OF INVENTION

Technical Problem

However, in PTL 1, the gas released as the evacuation inducer may include hydrogen gas, which is a main component, and gas that is difficult to be evacuated by the IP or the NEG pump, and it may take a long time to reach the extreme high vacuum state after restarting the IP. If it takes a long time to reach the extreme high vacuum state after restarting the IP, a downtime of the electron beam apparatus becomes long when, for example, the electron gun is replaced, which hinders the manufacturing process of the semiconductor device.

An object of the invention is to provide an electron beam apparatus and a method for controlling the electron beam apparatus that reduce a time required for an electron gun chamber to reach an extreme high vacuum state. A sputter ion pump and a non-evaporable getter pump are connected to the electron gun chamber.

Solution to Problem

In order to achieve the above-described object, the invention provides an electron beam apparatus that includes an electron gun configured to emit an electron beam and an electron gun chamber to which a sputter ion pump and a non-evaporable getter pump are connected. The electron beam apparatus includes a gas supply unit configured to supply at least one of hydrogen, oxygen, carbon monoxide, and carbon dioxide to the electron gun chamber.

The invention provides a method for controlling an electron beam apparatus including an electron gun configured to emit an electron beam and an electron gun chamber to which a sputter ion pump and a non-evaporable getter pump are connected. The method includes a gas supply step of supplying at least one of hydrogen, oxygen, carbon monoxide, and carbon dioxide to the electron gun chamber.

Advantageous Effect

According to the invention, it is possible to provide the electron beam apparatus and a method for controlling the electron beam apparatus that reduce a time required for the electron gun chamber to reach an extreme high vacuum state. The sputter ion pump and the non-evaporable getter pump are connected to the electron gun chamber.

BRIEF DESCRIPTION OF DRAWINGS

FIG. 1 is an overall configuration diagram of an electron beam apparatus.

FIG. 2 is a diagram showing an example of an electron gun chamber according to a first embodiment.

FIG. 3 is a diagram showing an example of an electron gun chamber according to a second embodiment.

FIG. 4 is a diagram showing an example of a material of a gas generation source according to the second embodiment.

FIG. 5 is a diagram showing an example of an electron gun chamber according to a third embodiment.

FIG. 6 is a diagram showing another example of the electron gun chamber according to the third embodiment.

FIG. 7 is a diagram showing an example of an electron gun chamber according to a fourth embodiment.

FIG. 8 is a diagram showing an example of an electron gun chamber according to a fifth embodiment.

FIG. 9 is a diagram showing an example of an electron gun chamber according to a sixth embodiment.

FIG. 10 is a diagram showing an example of a flow of processing according to the sixth embodiment.

DESCRIPTION OF EMBODIMENTS

Hereinafter, embodiments of an electron beam apparatus according to the invention will be described with reference to the accompanying drawings. The electron beam apparatus is an apparatus that allows a sample to be observed and processed by irradiating the sample with an electron beam, and includes various apparatuses such as a scanning electron microscope and a scanning transmission electron microscope. Hereinafter, as an example of the electron beam apparatus, the scanning electron microscope that allows the sample to be observed using the electron beam will be described.

First Embodiment

An overall configuration of a scanning electron microscope according to the present embodiment will be described with reference to FIG. 1. The scanning electron microscope includes an electron gun chamber 100, a focusing and deflecting chamber 110, a sample chamber 120, and a control unit 130.

In the electron gun chamber 100, an electron gun 101 that emits an electron beam is provided, and a sputter ion pump 102 and a non-evaporable getter pump 103 are connected. By connecting the sputter ion pump 102 and the non-evaporable getter pump 103, the electron gun chamber 100 is evacuated to an extreme high vacuum having a vacuum degree higher than that of an ultrahigh vacuum of $10^{-6}$ Pa to $10^{-8}$ Pa. The sputter ion pump 102 is also called an IP, and the non-evaporable getter pump 103 is also called a NEG pump. The electron gun chamber 100 is also connected to a gas supply unit 104 that supplies at least one of hydrogen, oxygen, carbon monoxide, and carbon dioxide, and an auxiliary pump (not shown). The auxiliary pump is a pump that performs a vacuum evacuation from atmospheric pressure, for example, a dry pump or a turbomolecular pump. A detailed configuration of the electron gun chamber 100 will be described with reference to FIG. 2.

The focusing and deflecting chamber 110 is evacuated by a first pump 112 and is evacuated differentially from the electron gun chamber 100 connected via a first opening 111. For the first pump 112, for example, a sputter ion pump is used. A focusing lens (not shown) and a deflector (not shown) are provided in the focusing and deflecting chamber 110, and the electron beam emitted from the electron gun 101 is focused or deflected.

The sample chamber 120 is evacuated by a second pump 122 and evacuated differentially from the focusing and deflecting chamber 110 connected via a second opening 121. As the second pump 122, for example, a turbomolecular pump is used. A sample table 124 on which a sample 123 is placed is provided in the sample chamber 120, and the sample 123 is irradiated with an electron beam focused and deflected in the focusing and deflecting chamber 110. Secondary electrons and reflected electrons emitted from the sample 123 by irradiation with the electron beam are detected by a detector (not shown) provided in the focusing and deflecting chamber 110.

The control unit 130 is a device that controls each part of the scanning electron microscope, and is, for example, a computer. The control unit 130 generates and displays an observation image based on a signal output by the detector.

The electron gun chamber 100 according to the present embodiment will be described with reference to FIG. 2. The electron gun 101 provided in the electron gun chamber 100 is an electron source that emits the electron beam, and is, for example, a thermal electron source that emits thermal electrons by heating or a field emission electron source that field-emits electrons by applying a high voltage. The electron beam emitted from the electron gun 101 is accelerated by an acceleration voltage applied to an acceleration electrode (not shown).

The sputter ion pump 102 is a pump that evacuates a gas by a getter action of a clean vapor-deposited film formed by atoms of cathodes sputtered by ionized gas. The ionized gas is formed by ionizing gas molecules with electrons reciprocating between the cathodes while spiraling due to electric and magnetic fields. An IP power supply 105 is connected to the sputter ion pump 102, and a high voltage for forming the electric field is applied. In the sputter ion pump 102, the gas is also evacuated by capturing the ionized gas inside the cathodes. In the sputter ion pump 102, an evacuation action is generated by the ionization of the gas, and thus the smaller residual gas, that is, the higher the vacuum degree, the lower the evacuation speed, and ultimate vacuum degree is an ultrahigh vacuum of $10^{-8}$ Pa.

The non-evaporable getter pump 103 is a pump that evacuates a gas by capturing the gas approaching a surface by heat-cleaning a metal having a high chemical reactivity with the gas, such as titanium and zirconium in an ultrahigh vacuum. The non-evaporable getter pump 103 is provided with a NEG heating unit 106 for heating. A NEG power supply 107 is connected to the NEG heating unit 106, and an electric power that allows the non-evaporable getter pump 103 to be heated is supplied. In a state in which the ultrahigh vacuum is reached by the sputter ion pump 102 performing a vacuum evacuation, the electric power is supplied from the NEG power supply 107 to operate the non-evaporable getter pump 103, so that the electron gun chamber 100 reaches the extreme high vacuum.

Since the non-evaporable getter pump 103 can maintain the high evacuation speed even in the ultrahigh vacuum, the electron gun chamber 100 can reach an extreme high vacuum having a vacuum degree higher than that of the ultrahigh vacuum, but an operating time is limited since the capturing amount of the gas is limited by a size of a surface area. That is, the evacuation speed of the non-evaporable getter pump 103 decreases due to a long-term use or a use at a low vacuum degree. For example, when the electron gun 101 is replaced, the non-evaporable getter pump 103 continues operating from the time when the sputter ion pump 102 is paused to the time when the sputter ion pump 102 is restarted, and the evacuation speed decreases as the operating time increases. Therefore, it takes a long time to reach the extreme high vacuum. Even if a gas supplied to restart the sputter ion pump 102 contains a gas that is difficult for the sputter ion pump 102 or the non-evaporable getter pump 103 to evacuate, the time to reach the extreme high vacuum becomes long.

Therefore, in the present embodiment, by supplying a gas that is easily evacuated by the sputter ion pump 102 or the non-evaporable getter pump 103 to the electron gun chamber 100 and restarting the sputter ion pump 102 in a short time, the evacuation speed of the non-evaporable getter pump 103 is not reduced. If the evacuation speed of the non-evaporable getter pump 103 does not decrease, the time to reach the extreme high vacuum can be reduced.

The gas supply unit 104 supplies at least one of hydrogen, oxygen, carbon monoxide, and carbon dioxide, which is easily evacuated by the sputter ion pump 102 and the non-evaporable getter pump 103, to the electron gun chamber 100. The gas supply unit 104 according to the present embodiment includes a gas generation source 201, a heating unit 202, and a heating power source 203. Each of the units will be described below.

The gas generation source 201 is a member that generates at least one of hydrogen, oxygen, carbon monoxide, and carbon dioxide, for example, an alloy, a hydride, an oxide, a carbon oxide, or a hydroxide that occludes the gas. It is desirable that a material of the gas generation source 201 is the same as that of the non-evaporable getter pump 103 so that the gas generated from the gas generation source 201 becomes the gas that can be easily evacuated by the non-evaporable getter pump 103. Further, if both materials are the same, it is desirable that a surface area of the gas generation source 201 is smaller than that of the non-evaporable getter pump 103 so that the amount of a gas generated from the gas generation source 201 is less than an evacuation allowance of the non-evaporable getter pump 103.

The heating unit 202 is a heater that heats the gas generation source 201, and raises a temperature of the gas generation source 201 until a temperature at which the gas is generated is reached. The heating unit 202 heats the gas generation source 201 to generate the gas when the gas is not evacuated by the sputter ion pump 102 even though the high voltage is applied from the IP power supply 105.

The heating power source 203 is a power source that supplies an electric power to the heating unit 202. The electric power is supplied, so that the heating unit 202 heats the gas generation source 201. The amount of electric power supplied to the heating unit 202 is adjusted based on a control executed by the control unit 130 and an operation performed by an operator.

According to the gas supply unit 104 in the present embodiment described above, the sputter ion pump 102 can be restarted in a short time, for example, when the electron gun 101 is replaced. That is, when the sputter ion pump 102 does not restart even though the IP power supply 105 applies the high voltage, the electric power is supplied from the heating power source 203 to the heating unit 202 to heat the gas generation source 201. Then, the gas generated by heating the gas generation source 201 restarts the sputter ion pump 102 in the short time, and thus the evacuation speed of the non-evaporable getter pump 103 is maintained. Hydrogen, oxygen, carbon monoxide, and carbon dioxide that are generated from the gas generation source 201 are gases that are easily evacuated by the sputter ion pump 102 and the non-evaporable getter pump 103, and thus along with maintaining the evacuation speed of the non-evaporable getter pump 103, the time to reach the extreme high vacuum can be reduced.

Second Embodiment

In the first embodiment, it has been described that a gas for restarting the sputter ion pump 102 is generated by heating the gas generation source 201. In the present embodiment, it will be described that the gas for restarting the sputter ion pump 102 is generated by irradiating the gas generation source 201 with a light. An overall configuration of a scanning electron microscope is the same as that according to the first embodiment, and thus a description thereof will be omitted.

The electron gun chamber 100 according to the present embodiment will be described with reference to FIG. 3. In the electron gun chamber 100, the electron gun 101 is provided, and the sputter ion pump 102, the non-evaporable getter pump 103, and the gas supply unit 104 are connected as in the first embodiment. The electron gun 101, the sputter ion pump 102, and the non-evaporable getter pump 103 are the same as those according to the first embodiment. The gas supply unit 104 according to the present embodiment includes the gas generation source 201, a light source 301, and a transmission window 303. Since the gas generation source 201 is the same as that according to the first embodiment, the light source 301 and the transmission window 303 will be described.

The light source 301 is a device that emits a light 302 for generating the gas from the gas generation source 201, and is, for example, a light emission diode (LED). The light 302 emitted from the light source 301 to the gas generation source 201 is preferably selected appropriately according to a material of the gas generation source 201. For example, as shown in FIG. 4, when the material of the gas generation source 201 is calcium carbonate or carboxylic acid, the light source 301 emits infrared rays. When calcium carbonate or carboxylic acid is irradiated with the infrared rays, a chemical change occurs due to heating and carbon dioxide is generated. The material that generates at least one of hydrogen, oxygen, carbon monoxide, and carbon dioxide by irradiation with ultraviolet rays may be used for the gas generation source 201. The light source 301 irradiates the gas generation source 201 with the light 302 to generate the gas when the gas is not evacuated by the sputter ion pump 102 even though a high voltage is applied from the IP power supply 105.

A lens that focuses the light 302 may be provided between the light source 301 and the gas generation source 201. An area irradiated with the light 302 may be controlled by moving a position of the lens along an axial direction of the light 302. A position irradiated with the light 302 may be controlled by changing a direction of the light source 301. The amount of gas generated from the gas generation source 201 can be adjusted by controlling the area and the position irradiated with the light 302. The amount of the generated gas may be adjusted by controlling an output of the light source 301. The amount of the generated gas is adjusted based on a control executed by the control unit 130 and an operation performed by an operator.

The transmission window 303 is a member through which the light 302 is transmitted from the light source 301 and that seals the vacuum electron gun chamber 100. It is preferable to use a material having a high transmittance of the light 302 for the transmission window 303. When the light source 301 is provided in the electron gun chamber 100, the transmission window 303 may be omitted.

According to the gas supply unit 104 in the present embodiment described above, the sputter ion pump 102 can be restarted in a short time as in the first embodiment when, for example, the electron gun 101 is replaced. That is, when the sputter ion pump 102 does not restart even though the IP power supply 105 applies the high voltage, the light source 301 emits the light 302 to generate the gas from the gas generation source 201. Then, the gas generated from the gas generation source 201 restarts the sputter ion pump 102 in a short time, and thus an evacuation speed of the non-evaporable getter pump 103 is maintained. Hydrogen, oxygen, carbon monoxide, and carbon dioxide that are generated from the gas generation source 201 are gases that are easily evacuated by the sputter ion pump 102 and the non-evaporable getter pump 103, and thus along with maintaining the evacuation speed of the non-evaporable getter pump 103, a time to reach an extreme high vacuum can be reduced.

According to the present embodiment, since the gas is generated by irradiation with the light 302, the amount of the generated gas for restarting the sputter ion pump 102 can be adjusted quickly.

Third Embodiment

It has been described that, a gas for restarting the sputter ion pump 102 is generated by heating the gas generation source 201 in the first embodiment, and by irradiating the gas generation source 201 with the light 302 in the second embodiment. In the present embodiment, it will be described that the gas for restarting the sputter ion pump 102 is generated by irradiating the gas generation source 201 with charged particles. An overall configuration of a scanning electron microscope is the same as that according to the first embodiment, and thus a description thereof will be omitted.

The electron gun chamber 100 according to the present embodiment will be described with reference to FIG. 5. In the electron gun chamber 100, the electron gun 101 is provided, and the sputter ion pump 102, the non-evaporable getter pump 103, and the gas supply unit 104 are connected as in the first embodiment. The electron gun 101, the sputter ion pump 102, and the non-evaporable getter pump 103 are the same as those according to the first embodiment. The gas supply unit 104 according to the present embodiment includes the gas generation source 201, a charged particle source 501, and an acceleration power source 502. Since the gas generation source 201 is the same as that according to the first embodiment, the charged particle source 501 and the acceleration power source 502 will be described.

The charged particle source 501 is a device that emits the charged particles for generating the gas from the gas generation source 201, and is an electron source such as an electron gun. The charged particle source 501 irradiates the gas generation source 201 with the charged particles, for example, electrons to generate the gas when the gas is not evacuated by the sputter ion pump 102 even though a high voltage is applied from the IP power supply 105.

An electromagnetic lens that focuses the charged particles may be provided between the charged particle source 501 and the gas generation source 201. A deflector that deflects the charged particles may be provided. The amount of the generated gas from the gas generation source 201 can be adjusted by controlling an area and a position irradiated with the charged particles. The amount of the generated gas may be adjusted by controlling an output of the charged particle source 501.

The acceleration power source 502 is a circuit that applies a voltage between the charged particle source 501 and the gas generation source 201. The voltage applied by the acceleration power source 502 accelerates the charged particles emitted from the charged particle source 501. That is, the amount of the generated gas from the gas generation source 201 can also be adjusted by controlling the voltage applied by the acceleration power source 502. The amount of the generated gas is adjusted based on a control executed by the control unit 130 and an operation performed by an operator.

Another example of the electron gun chamber 100 according to the present embodiment will be described with reference to FIG. 6. In FIG. 6, in order to use the electron gun 101 instead of the charged particle source 501 in FIG. 5, a position of the gas generation source 201 is changed and a deflector 601 is provided. That is, an electron beam emitted from the electron gun 101 is deflected by the deflector 601, and the gas generation source 201 arranged close to an optical axis 602 of the electron beam is irradiated with the electron beam. As the deflector, an electrostatic deflector or an electromagnetic deflector is used. The electron gun 101 and the deflector 601 operate when the gas is not evacuated by the sputter ion pump 102 even though the high voltage is applied from the IP power supply 105, and irradiate the gas generation source 201 with the electron beam to generate the gas.

According to the gas supply unit 104 in the present embodiment described above, the sputter ion pump 102 can be restarted in a short time as in the first embodiment and the second embodiment when, for example, the electron gun 101 is replaced. That is, when the sputter ion pump 102 does not restart even though the IP power supply 105 applies the high voltage, the gas is generated from the gas generation source 201 by irradiating the gas generation source 201 with the charged particles from the charged particle source 501 or the electron beam from the electron gun 101. Then, the gas generated from the gas generation source 201 restarts the sputter ion pump 102 in a short time, and thus the evacuation speed of the non-evaporable getter pump 103 is maintained. Hydrogen, oxygen, carbon monoxide, and carbon dioxide that are generated from the gas generation source 201 are gases that are easily evacuated by the sputter ion pump 102 and the non-evaporable getter pump 103, and thus along with maintaining the evacuation speed of the non-evaporable getter pump 103, a time to reach an extreme high vacuum can be reduced.

According to the present embodiment, since a higher energy can be given to the gas generation source 201 by irradiating the gas generation source 201 with the charged particles, an inexpensive material having a small occlusion of a gas can be used for the gas generation source 201.

Fourth Embodiment

In the first embodiment to the third embodiment, it has been described that a gas for restarting the sputter ion pump 102 is generated from the gas generation source 201 and supplied to the electron gun chamber 100. In the present embodiment, it will be described that the gas for restarting the sputter ion pump 102 is supplied from a gas cylinder. An overall configuration of a scanning electron microscope is the same as that according to the first embodiment, and thus a description thereof will be omitted.

The electron gun chamber 100 according to the present embodiment will be described with reference to FIG. 7. In the electron gun chamber 100, the electron gun 101 is provided, and the sputter ion pump 102, the non-evaporable getter pump 103, and the gas supply unit 104 are connected, as in the first embodiment. The electron gun 101, the sputter ion pump 102, and the non-evaporable getter pump 103 are the same as those according to the first embodiment. The gas supply unit 104 according to the present embodiment includes a gas cylinder 701, a pipe 702, and a valve 703.

The gas cylinder 701 is a container that encloses any gas of hydrogen, oxygen, carbon monoxide, or carbon dioxide, and is connected to the electron gun chamber 100 via the pipe 702 and the valve 703. The gas enclosed in the gas cylinder 701 is supplied to the electron gun chamber 100 through the pipe 702 when the valve 703 is opened. That is, the valve 703 is opened and the gas is supplied from the gas cylinder 701 to the electron gun chamber 100 when the gas is not evacuated by the sputter ion pump 102 even though a high voltage is applied from the IP power supply 105. The amount of the gas supplied to the electron gun chamber 100 is adjusted by a degree of opening of the valve 703. The degree of opening of the valve 703 is adjusted based on a control executed by the control unit 130 and an operation performed by an operator.

According to the gas supply unit 104 in the present embodiment described above, for example, when the electron gun 101 is replaced, the sputter ion pump 102 can be restarted in a short time as in the first embodiment to the third embodiment. That is, when the sputter ion pump 102 does not restart even though the IP power supply 105 applies the high voltage, the valve 703 is opened to supply the gas from the gas cylinder 701 to the electron gun chamber 100. Then, since the sputter ion pump 102 is restarted in a short time by any of the supplied hydrogen, oxygen, carbon monoxide, or carbon dioxide gas, an evacuation speed of the non-evaporable getter pump 103 is maintained. The gas supplied from the gas cylinder 701 is a gas that is easily evacuated by the sputter ion pump 102 and the non-evaporable getter pump 103, and thus along with maintaining the evacuation speed of the non-evaporable getter pump 103, a time to reach an extreme high vacuum can be reduced.

The gas supply unit 104 including a set of the gas cylinder 701, the pipe 702, and the valve 703 may be a single set as shown in FIG. 7, or a plurality of sets may be connected to the electron gun chamber 100.

Fifth Embodiment

In the first embodiment to the fourth embodiment, it has been described that the gas supply unit 104 is connected to the electron gun chamber 100. A gas supplied from the gas supply unit 104 is used for restarting the sputter ion pump 102. In the present embodiment, it will be described that the gas supply unit 104 is provided in a vicinity of the sputter ion pump 102. An overall configuration of a scanning electron microscope is the same as that according to the first embodiment, and thus a description thereof will be omitted.

The electron gun chamber 100 according to the present embodiment will be described with reference to FIG. 8. In the electron gun chamber 100, the electron gun 101 is provided, and the sputter ion pump 102, the non-evaporable getter pump 103, and the gas supply unit 104 are connected, as in the first embodiment to the fourth embodiment. The present embodiment differs from the first embodiment to the fourth embodiment in that the gas supply unit 104 is provided in a vicinity of the sputter ion pump 102. More specifically, the gas supply unit 104 is provided at a position that is closer to the sputter ion pump 102 than is the non-evaporable getter pump 103. With such an arrangement, the gas supplied from the gas supply unit 104 can reach the sputter ion pump 102 without being captured by the non-evaporable getter pump 103 provided at a position farther than the sputter ion pump 102.

According to the present embodiment, for example, when the electron gun 101 is replaced, the sputter ion pump 102 can be restarted in a shorter time. That is, the gas is supplied from the gas supply unit 104 provided in the vicinity of the sputter ion pump 102 when the sputter ion pump 102 does not restart even though the IP power supply 105 applies a high voltage. Since the supplied gas reaches the sputter ion pump 102 without being captured by the non-evaporable getter pump 103, the sputter ion pump 102 can be restarted in a shorter time. As a result, the gas supplied from the gas supply unit 104 is not captured by the non-evaporable getter pump 103. Accordingly, an evacuation speed of the non-evaporable getter pump 103 is maintained. The gas supplied from the gas supply unit 104 is a gas that is easily evacuated by the sputter ion pump 102 and the non-evaporable getter pump 103, and thus along with maintaining the evacuation speed of the non-evaporable getter pump 103, a time to reach an extreme high vacuum can be reduced.

Sixth Embodiment

In the first embodiment to the fifth embodiment, it has been described that the gas supply unit 104 supplies a gas when the sputter ion pump 102 does not restart even though the IP power supply 105 applies a high voltage. In the present embodiment, it will be described that the amount of the gas supplied from the gas supply unit 104 is controlled based on an ionization current flowing through the sputter ion pump 102. An overall configuration of a scanning electron microscope is the same as that according to the first embodiment, and thus a description thereof will be omitted.

The electron gun chamber 100 according to the present embodiment will be described with reference to FIG. 9. In the electron gun chamber 100, the electron gun 101 is provided, and the sputter ion pump 102, the non-evaporable getter pump 103, and the gas supply unit 104 are connected, as in the first embodiment to the fifth embodiment. Differences between the present embodiment and the first embodiment to the fifth embodiment are that, an ammeter 901 is provided on the sputter ion pump 102, and the control unit 130 controls the gas supply unit 104 based on a measured value of the ammeter 901.

The ammeter 901 measures the ionization current flowing through the sputter ion pump 102 to which the high voltage is applied by the IP power supply 105. The ionization current is a current generated when a gas ionized by the sputter ion pump 102 spatters the cathode or is captured by the cathode, and serves as a guide for gas evacuation performed by the sputter ion pump 102. That is, when the ionization current measured by the ammeter 901 exceeds a predetermined threshold value, it can be determined that the sputter ion pump 102 has restarted.

The control unit 130 controls the gas supply unit 104 based on the measured value of the ammeter 901. Specifically, when the IP power supply 105 applies the high voltage to the sputter ion pump 102, if the measured value of the ammeter 901 is less than the threshold value, the control unit 130 supplies the gas to the gas supply unit 104, and if the measured value exceeds the threshold value, the gas supply is stopped. By such a control, the gas supplied from the gas supply unit 104 can be reduced to a minimum amount required for restarting the sputter ion pump 102. By minimizing a gas supply amount of the gas supply unit 104, it is not necessary to operate the non-evaporable getter pump 103 excessively.

An example of a flow of processing according to the present embodiment when the electron gun 101 is replaced in the configuration shown in FIG. 9 will be described with reference to FIG. 10.

(S1001)

The control unit 130 stops an electron beam irradiation from the electron gun 101 based on an instruction from an operator.

(S1002)

The control unit 130 turns off the IP power supply 105 in order to pause the sputter ion pump 102 based on the instruction from the operator.

(S1003)

The operator replaces the electron gun 101.

(S1004)

The control unit 130 turns on the IP power supply 105 in order to restart the sputter ion pump 102 based on the instruction from the operator.

(S1005)

The control unit 130 determines, based on the measured value of the ammeter 901, whether the sputter ion pump 102 has restarted, that is, whether the evacuation has resumed by the sputter ion pump 102. If the evacuation is not resumed by the sputter ion pump 102, the processing proceeds to S1006, and if the evacuation is resumed, the processing proceeds to S1007.

(S1006)

The control unit 130 supplies the gas from the gas supply unit 104 to the electron gun chamber 100. If the gas has already been supplied, the amount of the supplied gas may be increased.

(S1007)

The control unit 130 stops supply of the gas from the gas supply unit 104 to the electron gun chamber 100. If no gas is supplied, the present step is skipped.

By the above flow of the processing, it is possible to reduce a time required for the electron gun chamber 100 to reach an extreme high vacuum when the electron gun 101 is replaced. That is, since the sputter ion pump 102 can be restarted while minimizing the amount of gas supplied from the gas supply unit 104, it is not necessary to operate the non-evaporable getter pump 103 excessively. As a result, the evacuation speed of the non-evaporable getter pump 103 is maintained, and the supplied gas is a gas that is easily evacuated by the sputter ion pump 102 and the non-evaporable getter pump 103. Accordingly, the time required to reach the extreme high vacuum is reduced.

As described above, a plurality of embodiments of the electron beam apparatus according to the invention has been described. The invention is not limited to the above embodiments, and can be embodied by modifying constituent elements without departing from a spirit of the invention. A plurality of constituent elements disclosed in the above embodiments may be combined as appropriate. Further, some constituent elements may be deleted from all the constituent elements shown in the above embodiments.

REFERENCE SIGN LIST

100: electron gun chamber
101: electron gun
102: sputter ion pump
103: non-evaporable getter pump
104: gas supply unit
105: IP power supply
106: NEG heating unit
107: NEG power supply
110: focusing and deflecting chamber
111: first opening
112: first pump
120: sample chamber
121: second opening
122: second pump
123: sample
124: sample table
130: control unit
201: gas generation source
202: heating unit
203: heating power source
301: light source
302: light
303: transmission window
501: charged particle source
502: acceleration power source
601: deflector
602: optical axis
701: gas cylinder
702: pipe
703: valve
901: ammeter

The invention claimed is:

1. An electron beam apparatus that includes an electron gun configured to emit an electron beam and an electron gun chamber to which a sputter ion pump and a non-evaporable getter pump are connected, the electron beam apparatus comprising:
a gas supply unit configured to supply at least one gas, wherein the gas is at least one of hydrogen, oxygen, carbon monoxide, and carbon dioxide to the electron gun chamber,
wherein
the gas supply unit includes a gas generation source configured to generate the at least one gas,
the gas generation source is an alloy configured to occlude the at least one gas,
the alloy is a same material as the non-evaporable getter pump, and
a surface area of the alloy is smaller than a surface area of the non-evaporable getter pump.

2. The electron beam apparatus according to claim 1, wherein
the gas generation source is any one of a hydride, an oxide, a carbon oxide, and a hydroxide.

3. The electron beam apparatus according to claim 1, wherein
the gas supply unit further includes a heating source configured to heat the gas generation source.

4. The electron beam apparatus according to claim 1, wherein
the gas supply unit further includes a light source configured to irradiate the gas generation source with a light.

5. The electron beam apparatus according to claim 4, wherein
the gas generation source is calcium carbonate or carboxylic acid, and
the light source is configured to emit infrared rays.

6. The electron beam apparatus according to claim 1, wherein
the gas supply unit further includes a charged particle source configured to irradiate the gas generation source with charged particles.

7. The electron beam apparatus according to claim 1, wherein
the gas supply unit includes a gas cylinder that encloses the gas and a valve that is connected between the gas cylinder and the electron gun chamber.

8. The electron beam apparatus according to claim 1, wherein
the gas supply unit is provided at a position that is closer to the sputter ion pump than the gas supply unit is to the non-evaporable getter pump.

9. The electron beam apparatus according to claim 1, wherein
the sputter ion pump includes an ammeter configured to measure an ionization current, and
the gas supply unit is controlled based on a measured value of the ammeter.

10. The electron beam apparatus according to claim 9, wherein
based on the measured value of the ammeter, the gas supply unit supplies the gas when it is determined that the gas is not evacuated by the sputter ion pump, and stops the supply of the gas when it is determined that the gas is evacuated by the sputter ion pump.

11. The electron beam apparatus according to claim 10, wherein
the gas supply unit increases a supply amount of the gas until it is determined that the gas is evacuated by the sputter ion pump.

12. A method for controlling an electron beam apparatus including an electron gun configured to emit an electron beam and an electron gun chamber to which a sputter ion pump and a non-evaporable getter pump are connected, the method comprising:
a gas supply step of supplying at least one gas, wherein the gas is at least one of hydrogen, oxygen, carbon monoxide, and carbon dioxide to the electron gun chamber, providing a gas generation source configured to generate the at least one gas, wherein:

the gas generation source is an alloy configured to occlude the at least one gas, the alloy is a same material as the non-evaporable getter pump, and a surface area of the alloy is smaller than a surface area of the non-evaporable getter pump.

* * * * *